(12) United States Patent
Peeters

(10) Patent No.: US 7,398,442 B2
(45) Date of Patent: Jul. 8, 2008

(54) ELECTRONIC CIRCUIT WITH ASYNCHRONOUSLY OPERATING COMPONENTS

(75) Inventor: Adrianus Marinus Gerardus Peeters, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 115 days.

(21) Appl. No.: 10/518,273

(22) PCT Filed: Jun. 5, 2003

(86) PCT No.: PCT/IB03/02387

§ 371 (c)(1),
(2), (4) Date: Sep. 2, 2005

(87) PCT Pub. No.: WO04/001433

PCT Pub. Date: Dec. 31, 2003

(65) Prior Publication Data

US 2006/0038582 A1     Feb. 23, 2006

(30) Foreign Application Priority Data

Jun. 21, 2002    (EP) .................................. 02077495

(51) Int. Cl.
*G01R 31/28*    (2006.01)

(52) U.S. Cl. ..................................................... 714/731
(58) Field of Classification Search ................... 714/731
See application file for complete search history.

(56) References Cited

U.S. PATENT DOCUMENTS

| | | | |
|---|---|---|---|
| 5,406,216 A | 4/1995 | Millman et al. | |
| 6,081,913 A * | 6/2000 | Narayanan et al. | 714/724 |
| 6,895,540 B2 * | 5/2005 | Chen et al. | 714/726 |

* cited by examiner

*Primary Examiner*—James C. Kerveros
(74) *Attorney, Agent, or Firm*—Larry Liberchuk

(57) ABSTRACT

An electronic circuit that includes components that operate asynchronously of one another. An interface element has inputs coupled to a respective one of the components. The interface element supplies a logic output signal that is a logic function of signals at the inputs and dependent on the relative timing of the signals at the inputs. The electronic circuit is switched to a test mode, in which test input signals are applied to the electronic circuit from a test signal source. During test a difference is caused to occur between the time intervals after which the test signal source affects different ones of the signals at the inputs of the interface element. Preferably the test control circuit activates said difference in the test mode and not in the normal operating mode.

7 Claims, 4 Drawing Sheets

ELECTRONIC CIRCUIT WITH ASYNCHRONOUSLY OPERATING COMPONENTS

Figure 1:
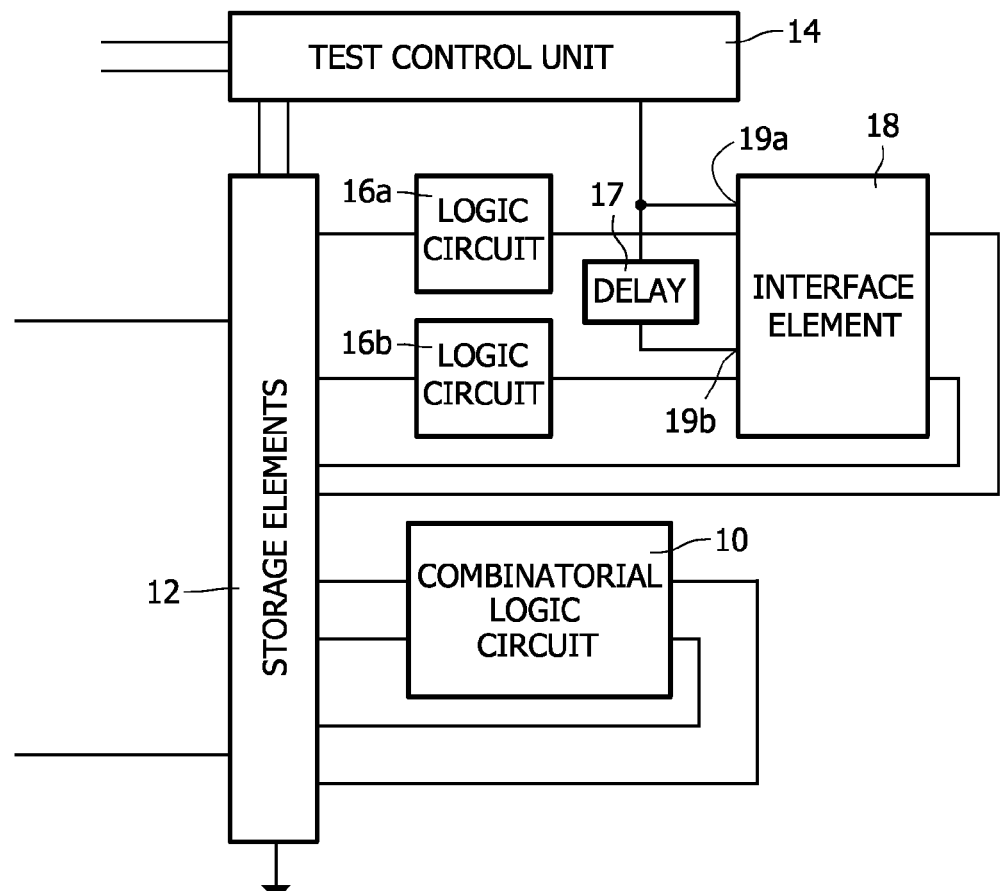

The invention relates to a method of testing an electronic circuit with asynchronously operating components and to an electronic circuit with asynchronously operating components.

For various reasons it may be desirable to include within an electronic circuit different components that operate asynchronously from one another. Asynchronous operation means that the electronic circuit lacks an overall clock signal that triggers all operations of the electronic circuit in a fixed time relation to one another. Asynchronously operating circuit include for example circuits that use handshake signals to synchronize pairs of communicating circuits, circuits that use independent clocks for different components and mixtures of such circuits.

Although different components of the electronic circuit generally operate asynchronously, some synchronization at isolated points in time is sometimes necessary, for example to exchange data or to sequence some operations. For this purpose special interface elements are used that generate logic signals that depend on logic input signals from the components and on the relative timing of transitions in these input signals. One example of such an interface element is an arbiter circuit, which generates successive grant signals, each time selecting no more than one of the components on request from the components on a first come first served basis. The logic function of the arbiter is to make one of its outputs logic high when a logic low to high transition is detected on a corresponding input and none of the other outputs is logic high.

Testing of electronic circuits is conventionally performed by applying different combinations of input signals to the circuit and comparing each resulting response at the outputs with a predetermined "correct" pattern, either bit for bit or through a signature that is compounded from the response. A preferable technique for applying test patterns uses a so-called scan chain, which switches a number of elements (such as flip-flops) of the electronic circuit to form a shift register during test. This shift register is called the scan chain. The input signals are transported into the electronic circuit through the scan chain and applied to logic circuitry from the scan chain. Subsequently the resulting response pattern is loaded from the outputs of the logic circuitry into the scan chain and transported through the circuit via the scan chain to a test result comparator. Thus, a thorough test can be executed with little overhead.

This test technique does not work satisfactorily for interface elements between asynchronously operating circuits. Due the fact that the logic output signals of such interface elements depend on the relative timing of the input signals, simultaneous application of different input signals during the conventional test does not lead to reproducible results. The relative timing of the signals that arrive at the interface element may depend on the speed of the logic circuitry between the test input and the logic circuitry. This causes difficulties during test comparison.

In addition, any changes in the input signals of the interface elements prior to the application of the test signals may affect the logic value of the output signals, and even the question whether the output signals have any defined logic level. A particular problem here is metastability, which affects the time before the interface element assumes a well-defined output, dependent on the closeness of the timing of the input signals. When changes occur in the input signal of the interface element, due to transport of input signals through the scan chain, this may bring the interface element to an undefined state at the start of application of the test input signals. This also makes the output signals unpredictable. Similar problems may arise during sampling of output signals from interface elements during normal operation.

Among others, it is an object of the invention to provide for an electronic circuit that permits well defined sampling of output signals from an interface element whose logic output depends on the relative timing of its input signals.

Among others, it is an object of the invention to provide for an electronic circuit with asynchronously operating components and an interface element coupled to the components, which provides for well-defined testing of the interface elements.

Among others, it is an object of the invention to provide for a method of testing of electronic circuits with asynchronously operating components which provides for well defined output signals from interface elements whose logic output depends on the relative timing of its input signals.

Among others, it is a further object of the invention to provide for such a method or electronic circuit which provides well defined output signals during test even if test input signals affect the interface element through intervening logic circuitry or if varying patterns of input signals are applied to the interface element prior to applying a relevant test signal.

Among others, it is a further object of the invention to provide for such a method or electronic circuit which does not substantially affect the speed of the electronic circuit during normal operation, when the electronic circuit is not being tested.

The invention provides for a circuit according to claim 1. According to the invention the electronic circuit provides for sampling after in which input signals are forced to affect the interface elements with different delays, the delays being activated selectively prior to sampling. Thus, on one hand the delays do not normally slow down the circuit and on the other hand the delays ensure a well-defined temporal sequence in which the signals affect the interface element. This ensures a predictable output signal of the interface element when it is sampled.

This is used in particular for by a test control circuit that switches the electronic circuit between a test mode and a normal operating mode. In the test mode normal input signals are replaced by test signals from a test signal source. The test control circuit activates the different delays in the test mode and not in the normal operating mode. Thus, on one hand the delays do not slow down the circuit in the normal operating mode and on the other hand the delays ensure a well-defined temporal sequence in which the test signals affect the interface element in the test mode. This ensures a predictable output signal of the interface element when it is tested. As a result the interface element can be tested using conventional test circuits that compare the output with a standard "good" output.

In an embodiment, the interface has enabling inputs that are used to temporarily disable the inputs of the interface element during activation, and to reenable the inputs delayed with respect to one another. Thus, it is ensured in a simple way that the signals at different inputs will affect the interface element in a well-defined temporal sequence. As an alternative a well-defined temporal sequence may be realized by using one or more delay lines in the normal signal paths between the test signal source and the different inputs of the interface elements, the delays being activated temporarily, for example in the test mode. However, by using enabling of the inputs of the interface elements, it is ensured that the interface element cannot be brought into a meta-stable state by changes in the input signals closely before the start of relevant testing. In addition the temporal sequence of the effect of the signals is independent of any logic signal value dependent delay in logic circuitry between the test signal source and the interface element.

In yet a further embodiment the interface element is implemented as a set of cross-coupled logic gates, in which under control of clock signals the logic gates can be disconnected from the power supply so as to dynamically retain logic data. As described in a co-pending patent application of the inventors this can be used to switch the logic gates into a configuration in which test data can be transported to or from the logic gates though a path that differs from the signal paths during normal operation. In the present invention, the clock signals of different ones of the logic gates are activated so that the power supplies to different ones of the logic gates switch on with a delay with respect to one another. This allows signals to affect the interface element in a well-defined temporal sequence.

These and other objects and advantageous aspects of the circuit and method according to the invention will be described in more details using the following FIGS.

Figure 7:
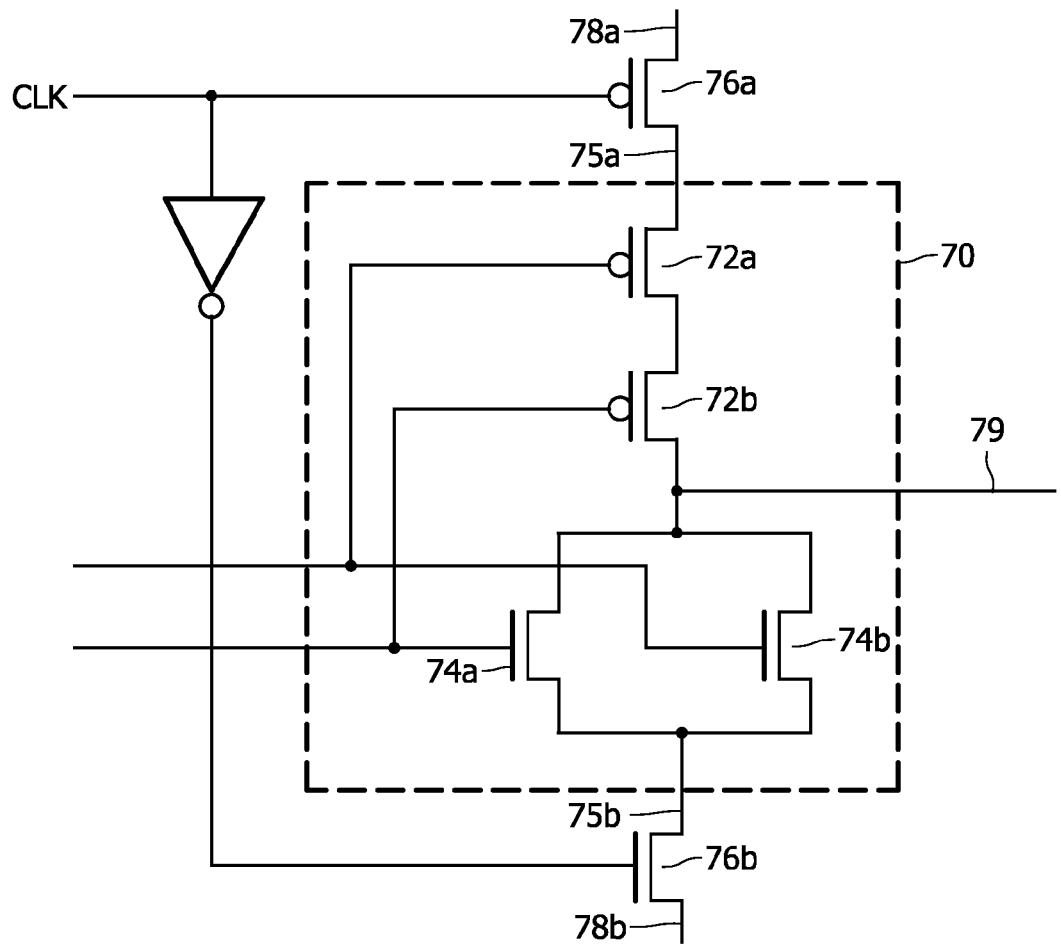

FIG. 1 shows an electronic circuit;
FIGS. 2-5 shows embodiments of an interface element;
FIG. 6 shows a further electronic circuit;
FIG. 7 shows a clocked NOR gate.

FIG. 1 shows an electronic circuit. The electronic circuit comprises combinatorial logic circuitry 10, storage elements 12 and a test control unit 14. Combinatorial logic circuitry 10 has inputs and outputs coupled to storage elements 12 (although single lines are shown to connect the combinatorial circuitry 10 and other components, it should be understood that each of these lines may represent a plurality of independent connections). Test control unit 14 is coupled to storage elements 12. The electronic circuit is also shown to contain additional combinatorial logic circuitry 16a, b, a delay element 17 and an interface element 18. Test control unit 14 has a test preparation output coupled to enabling inputs 19a,b of interface element 18, directly and via delay element 17 respectively.

In operation test control unit is coupled to storage elements 12 in a conventional way to select between a normal mode of operation and a test mode of operation. In the normal mode of operation data from storage elements 12 is fed to combinatorial logic circuitry 10 and the resulting logic output data of combinatorial logic circuitry 10 is loaded into the storage elements 12. From there the data may again be fed to combinatorial logic circuitry 10 and so on. Some of the storage elements 12 may even be transparent in normal operation. Also data from storage elements 12 may be fed to external outputs or data may be fed to storage elements 12 from external inputs. In the test mode, test control unit commands storage elements 12 to operate as a shift register to enter test signal patterns, to supply these signal patterns to combinatorial logic circuitry 10, to capture the resulting test output patterns and to shift out the test signal patterns for inspection.

In normal operation different ones of the storage elements 12 may operate asynchronously from one another. That is, their timing may be controlled by clock signals that are not synchronized, or they may operate using handshake signals instead of clock signals or any other form of timing may be used that does not ensure a predetermined timing relationship between different ones of the storage element 12.

This type of asynchronous operation requires special types of interface elements 18. These interface elements 18 produce logic output signal levels that depend not only on the logic level of its input signals, but also on the relative timing of transitions in the logic levels of its input signals. By way of example only one such interface element 18 is shown, together with separate logic circuitry 16a,b between the respective inputs of this interface element 18 and the storage elements 12. However, it will be understood that in practice the electronic circuit may contain many such interface elements 18. Also the way this interface element is coupled to storage elements 12 is only shown by way of example. When a plurality of interface elements is present they may share delay element 17.

One example of such an interface element is an arbiter circuit, which has inputs for receiving request signals, and outputs, each corresponding to a respective one of the inputs, for producing grant signals. The arbiter makes at most one of the grant signals logic high at a time on a first come first served basis. More particularly, if none of the outputs is logic high the arbiter responds to a low to high transition of the signal at a first one of its inputs by making the signal at a corresponding first one of its outputs logic high. The arbiter makes the signal at the first one of the outputs logic low when the signal at the first one of the inputs becomes logic low. If a low to high transition occurs at a second one of the inputs when the first one of the outputs is logic high, the arbiter does not make the corresponding second one of the outputs logic high until the signal at the first one of the outputs has been made logic low. Thus, the logic output levels depend on the relative timing of transitions of the input signals.

The test preparation output of test control unit 14 and delay element 17 serve to make interface element 18 produce predictable output signals during test. In normal operation test control unit 14 first keeps the test preparation output to a level that disables the inputs of interface element 18. During a test in test mode, test control unit 14 first drives the test preparation output to a level that disables the inputs of interface element 18. While the signal at the test preparation output is at this level storage elements 12 are controlled to set up a test pattern that affects the signals at the inputs 19a,b of interface element 18. Subsequently, test control unit changes the level of the signal at the test preparation output, so that the inputs of interface element 18 are enabled. Due to the operation of delay element 17 a first one of the inputs 19a is enabled a predetermined time interval before a second one of the inputs 19b is enabled. Thus, the signals from storage elements 12 affect interface element 18 in a well defined temporal sequence, giving rise (if interface element operates properly) to well defined output signals, which are loaded into storage elements 12 for subsequent inspection.

Although the invention has been illustrated in FIG. 1 with a test interface having separate logic circuitry 16a,b between it and storage elements 12, and outputs coupled directly to storage elements 12, the invention is of course not limited to such a configuration: interface element 18 may have it inputs coupled directly to storage elements 12 and/or its outputs may be coupled to storage elements via further logic circuitry (not shown). Also, although an interface element 18 is shown with an output for each input, which is typical for an arbiter, of course interface elements with fewer or more outputs may be used, of which some or all may be coupled to storage elements 12. Furthermore, although the invention has been illustrated in a form where results of the test are shifted out of scan chain 12, it will be understood that it is not necessary that all results are inspected explicitly, for example a signature of the results may be formed in a conventional way.

Figure 2:
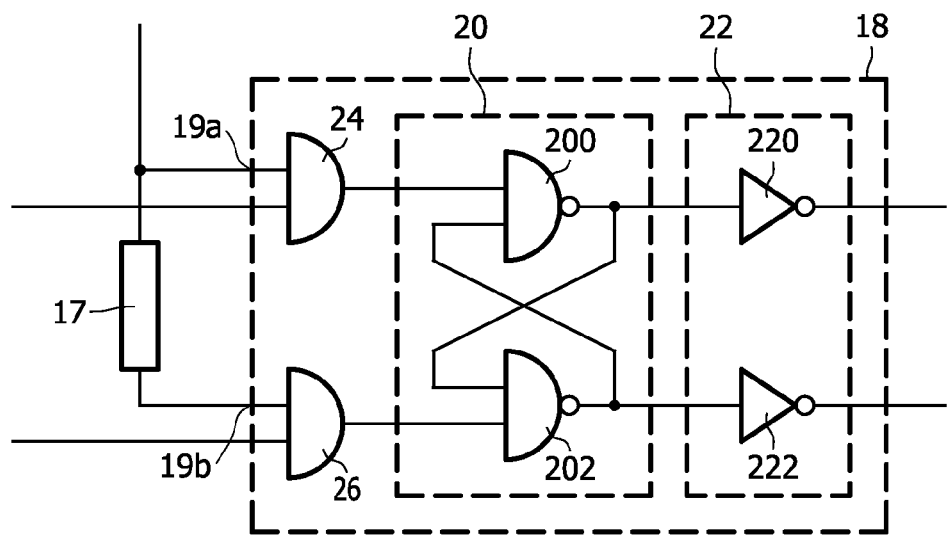

FIG. 2 shows an example of an interface element 18 in combination with a delay element 17. Interface element 18 contains a flip-flop circuit 20, an output stage 22 and enabling gates 24, 26. The flip-flop circuit 20 contains a pair of cross-coupled NAND gates 200, 202. The output stage contains a pair of inverters 220, 222, each coupled between the output of a respective one of the NAND gates 200, 202 of flip-flop 20 and a respective one of the outputs of interface element 18. Preferably, inverters 220, 222 have been designed so that their threshold voltage is lower than that of NAND gates 200, 202. Enabling gates 24, 26 are AND gates, each having a first input coupled to the signal inputs of the interface element 18, a second input coupled to a respective one of the inputs 19a,b of interface element 18, and an output coupled to an input of a respective one of the NAND gates 200, 202 in flip-flop 20. Thus, second inputs of AND gates 24, 26 are respectively coupled directly and coupled via delay element 17 to the test preparation output of the test control unit 14 as shown in FIG. 1. In operation, interface element 18 will produce logic low output signals when both its input signals are logic low. In this case, NAND gates 200, 202 produce logic high output signals that are inverted by inverters 220, 222. In normal operation the test preparation signal at the second inputs of AND gates 24, 26 is logic high. When one of the input signals is made logic high the NAND gate 200, 202 that receives this input signal via AND gates 24, 26 switches its output to logic low, resulting in a logic high at the output of the corresponding inverter 220, 222. If the other one of the input signals later also switches to logic high, flip-flop 20 simply retains its earlier state.

When both input signals switch high nearly simultaneously inverters 220, 22 do not produce a logic high output signal until the output signal from NAND gates 200, 202 has dropped below the threshold level of inverters 220, 222. Because the threshold level of NAND gates 200, 202 is higher than that of inverters 220, 222, this will only happen once flip-flop 20 starts to assume a definite state. Dependent on the temporal closeness of transitions at the inputs, it may take some time before flip-flop 20 starts to assume this definite state.

Of course, it will be appreciated that the details of the interface element are not relevant to the invention, for example, instead of using inverters 220, 222 with special thresholds, a special semi-inverter may be used with a series arrangement of the main current channels of a P-MOS transistor and an NMOS transistor, one of the outputs of the flip-flop 20 being coupled to the control electrodes of these transistors, the series arrangement being coupled between the other output of flip-flop 20 and a power supply connection, an output signal being derive from a node between the main current channels. In this semi-inverter circuit the output can only make a transition when the difference between the output levels of the signals at the outputs of flip-flop 20 exceeds the threshold level of one of the transistors in the semi-inverter.

When the test preparation signal is low in the test mode, AND gates 24, 26 disable the signals from inputs 19a,b. The signals at the inputs of NAND gates 200, 202 in flip-flop 20 are both low, forcing the output signals of flip-flop 20 to logic high and the output signals of inverters 220, 222 to logic high. Still in the test mode test control unit 14 subsequently makes the test preparation signal logic high, causing first a first one of AND gates 24 to pass the signal from input 19a and after a delay determined by delay element 17, causing a second one of the AND gates 26 to pass the signal from input 19b. Thus, the signals from inputs 19a,b reach flip-flop 20 in a well defined temporal sequence, leading to a well-defined state of flip-flop 20 in a well defined time. As a result, the output signals from interface element during this test are predictable, so that they may be compared with a standard "correct" output value. Any kind of delay element 17 may be used. Since the delay caused by delay element 17 is only determinative for the test when the test preparation signal enables the inputs of interface element 18 an asymmetric delay element may be used, which provides a different delay, or no delay, when the inputs of interface element 18 are disabled. Using a reduced delay on disabling may be used to speed up the test. Although only one delay element is shown, it will be understood that delay elements may be included between test control unit 14 and both of the inputs 19a,b, as long as the delays caused by the delay elements provide the required difference between the delays with which the inputs are enabled.

Figure 3:
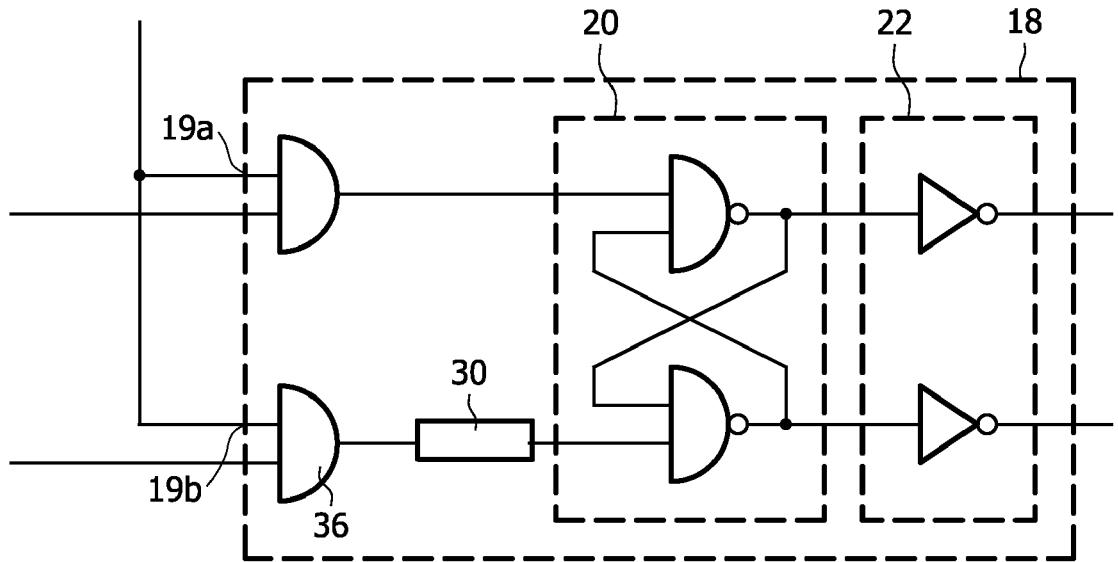

FIG. 3 shows an alternative example of an embodiment of interface element. In this embodiment delay element 17 has been omitted and a delay element 30 has been included between AND gate 36 and the input of NAND gate 202. Thus, it is ensured that there is a delay of the effect of making the test preparation signal high. This circuit has the disadvantage that the delay always affects the input signals, also during normal operation. However, in some circuits this is not a problem.

Similarly, as an alternative to using disabling inputs, one or more delay elements may be inserted anywhere in one or more signal paths form storage elements 12 to interface element 18, so as to ensure a well defined temporal sequence of input signals when a test pattern is newly applied from storage elements 12. In this case test control unit 14 is preferably coupled to these delay elements so as to relatively reduce their delay during normal operation and to relatively increase their delay in the test mode. Thus, no unnecessary delay occurs during normal operation. Preferably, in this case, storage elements 12 are designed so that they retain a fixed output signal during the time when the test pattern is shifted into the storage elements.

Of course, many other circuits may be used to realize an appropriate interface element. For example, AND gates 24, 26 may be eliminated by using three-input NAND gates in flip-flop 20 and coupling the test preparation signal to the third inputs. Different kinds of flip-flops may be used, using for example cross-coupled NOR gates, the definition of one or more of the logic levels in the circuit may be inverted, etcetera. What matters is that the normal input signals of the interface element are temporarily disabled from influencing the state of the interface element prior to test, and are subsequently reenabled during test in a way that leads to an unambiguously predictable temporal evolution of the input signals of the interface element.

Also, the invention is not limited to arbiter functions or mutual exclusion functions as shown in FIG. 2. Any kind of known interface function may be used that depends on relative timing of its input signal. Enabling circuits may be added to known interface circuits, for example by adding AND gates such as AND gates 24, 26 at their inputs, or by modifying these circuits in any other appropriate way. By driving the enabling inputs from test control unit 14 with different delays, a well-defined response is obtained.

In particular the invention is of course not limited to two-input interface elements. Interface elements with more than two inputs can easily be realized by combining a number of two input interface elements. In this case the enabling signals should of course enable different inputs with different delays. When interface elements are used in cascade, successive interface elements may be enabled each time with a greater delay than their predecessors in the cascade. Of course, instead of combinations of two-input interface elements, any multi-input interface circuit may be used, with added enabling inputs, which enable input signals from different inputs with different delays.

FIG. 3 illustrates a circuit in which the interface circuit, when disabled, returns its outputs to a state with a zero logic level at both outputs, and, when enabled, responds to the input signals starting from that state. Of course, the invention is not limited to such a starting state. Without deviating from the invention, interface elements may be used that set the outputs to different states.

Figure 4:
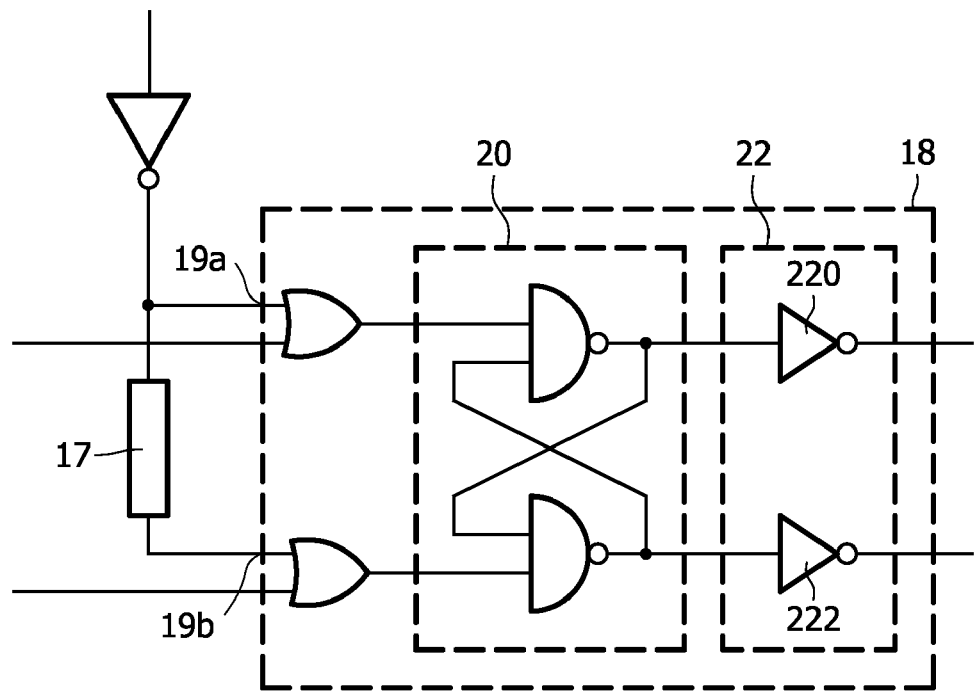
Figure 5:
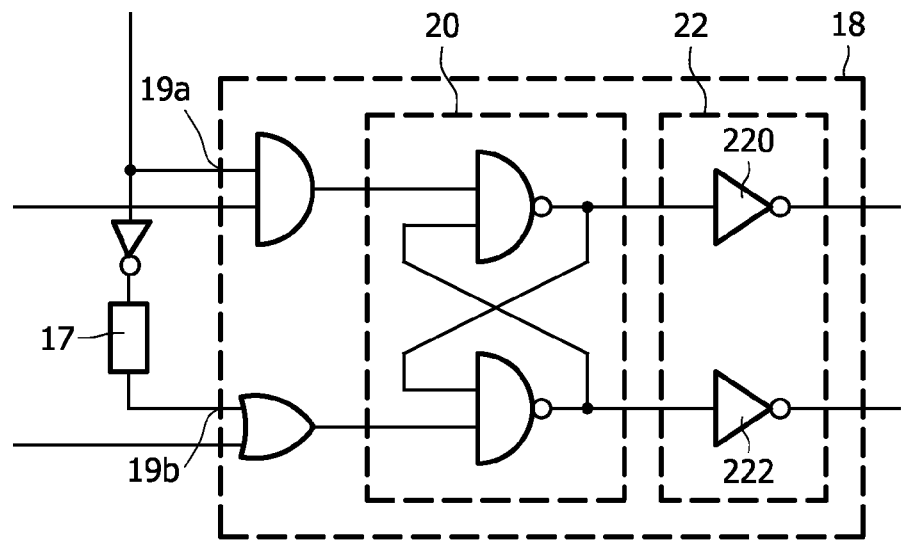
Figure 6:
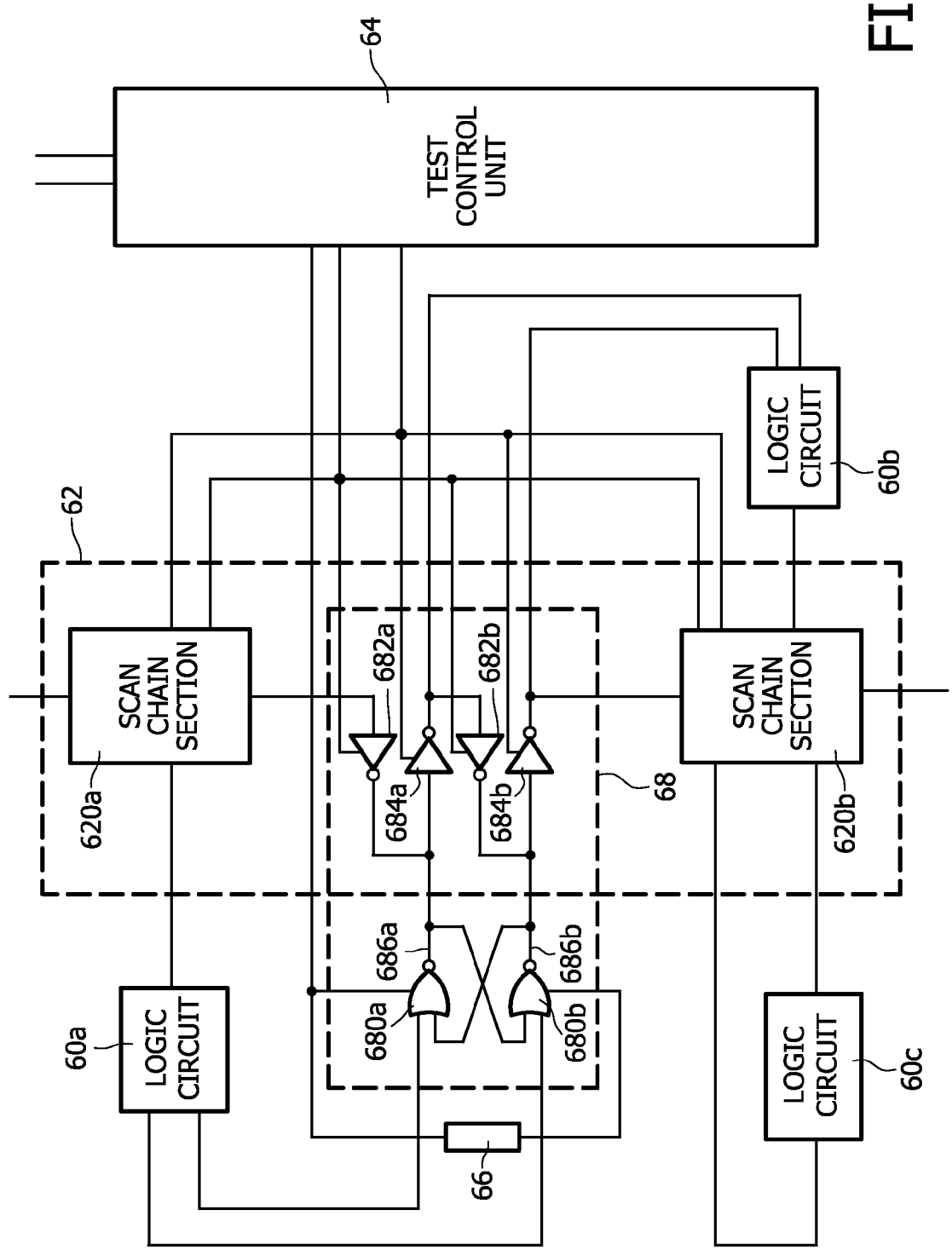

FIGS. 4-5 show examples of interface element that assume different states when disabled. FIG. 4 shows an interface element 18 that goes to a state with both inputs high when disabled. FIG. 5 shows an interface element 18 that goes to a state with one input logic high and another input logic low when disabled. In a further embodiment, the interface element may be designed so as to assume a programmed initial state, that is selected under control of a test control signal supplied during test, for example from storage elements 12. Thus, operation of the interface element may be tested under different conditions of relative timing.

The invention is not limited to interface elements that are used as mutual exclusion elements, such as described in the preceding. The invention can be applied to any type of interface element that produces a timing dependent output signal. For example, the invention could be applied to a set-reset flip-flop. Such a flip-flop is set to a first state by a pulse on a first signal line and reset to a second state by a signal on a second signal line. The last pulse to end determines the subsequent state of the set-reset flip-flop. During normal operation the set and reset pulses do not overlap, but in the test mode there is a risk of such overlapping pulses, when the circuit is prepared for a test or when a test pattern is applied that cannot occur during normal operation. This may lead to undeterministic behavior during the test.

Cross-coupled NAND gates, such as those of FIG. 2 form an example of a circuit that can be used as a set-reset flip-flop, when a pulse that temporarily drops to logic low is used at the inputs of the NAND gates. By temporarily disabling the input signals from influencing the state of the circuit prior to the test, and reenabling the input signals to do so during the test, a well-defined test is realized.

FIG. 6 shows part of an electronic circuit according to an embodiment of the invention. The electronic circuit contains various combinatorial logic circuits 60a-c, a scan chain 62, a test control unit 64, a delay circuit 66 and an interface element 68. Interface element 68 is part of scan chain 62. Test control unit 64 is coupled to scan chain 62 and the combinatorial logic circuits have inputs and outputs coupled to scan chain 62. Scan chain 62 contains sections 620a,b, interface element 68 being coupled between a pair of sections 620a,b via scan paths. Interface element 68 is also coupled to sections 620a,b via signal inputs and outputs of sections 620a,b and combinatorial logic circuits 600a,b via signal paths. By way of example an additional combinatorial logic circuit 60c has been shown. It will be understood that any number of such combinatorial logic circuits 60c may be present and that the combinatorial logic circuits 60a-c may be coupled anywhere to scan chain 62.

By way of examples an interface element that operates as a set-reset flip-flop is used. Interface element 68 contains a pair of cross-coupled NOR gates 680a,b, a pair of output inverters 682a,b and a pair of scanning inverters 684a,b. Nodes 686a,b each are coupled to an output of one of the cross-coupled NOR gates 680a,b, an output of one the scanning inverters 682a,b and an input of one of the output inverters 684a,b. NOR gates 680a,b, scanning inverters 682a,b and output inverters 684a,b are clocked devices, with clock inputs coupled to clock outputs of test control unit 64. The clock inputs of NOR gates 680a,b are coupled to the same clock output of test control unit 64, the clock input of a first one of NOR gates 680a directly, and the clock input of a second one of NOR gates 680b via delay circuit 66. Interface element 680 is coupled to the scan path via scanning inverters 682a,b and to the signal paths via output inverters 684a,b.

FIG. 7 shows an example of a clocked NOR gate 680a of the type used in interface element 68. The clocked NOR gate 680a contains a logic section 70, and power supply transistors 76a,b. Logic section 70 contains PMOS transistors 72a,b and NMOS transistors 74a,b coupled between local power supply nodes 75a,b so as to perform a NOR function, with an output at an output node 79. Power supply transistors 76a,b have main current channels coupled between local supply nodes 75a,b and common supply nodes 78a,b that supply power to a larger part of the electronic circuit. The clock inputs of NOR gate 680a are coupled to control electrodes of power supply transistors 76a,b. The signal inputs and outputs of NOR gate 680a are coupled to the control gates of PMOS transistors 72a,b and NMOS transistors 74a,b and to output node 79 respectively. Scanning inverters 682a,b and output inverters 684a,b have a similar structure, except of course that logic section 70 is replaced by a logic section that is appropriate to their function. The function of power supply transistors 76a,b is to control power interruption of the connections between both common power supply nodes 78a,b and output node 79. It will be understood that this function could be achieved by placing either or both of these transistors at other positions in the clocked NOR gate, for example between the transistors of logic section 70 and output node 79.

In operation the circuit of FIG. 6 is capable of operating in a normal mode and in a test mode. In the normal mode the clock signals from test control unit 64 make NOR gates 680a,b operate as normal NOR gates, by making the main current channels of power supply transistors 66a,b conductive. In the normal mode the clock signals similarly make output inverters 684a,b operational, but scanning inverters 682a,b are disabled. In the normal mode the sections 620a,b of scan chain 62 function as intermediate storage elements for signals that travel through combinatorial logic circuits 60a-d. Interface element 68 operates as a set reset flip-flop. By applying pulses that temporarily go high at the normal inputs the interface element can be set and reset.

In the test mode, the circuit first enters a shift-in phase in which test patterns are shifted through scan chain 62. During shifting interface element 68 operates as a dynamic shift register in scan chain. In this mode the scan chain 62 runs successively through one of the scanning inverters 682a,b and the corresponding output inverter 684a,b, subsequently it runs though the other scanning inverter 682a,b and the corresponding output inverter 684a,b. Test control unit 64 realizes shifting by supplying a clock signal that removes the power supply from NOR gates 680a,b, and by applying clock signals to scanning inverters 682a,b and output inverters 684a,b. that alternate allow power supply current to flow to scanning inverters 682a,b and to output inverters 684a,b in alternating phases. Thus, information from the input of a scanning inverter 682a,b is transferred inverted to the output of the scanning inverter 682a,b in one phase, and in another phase the information is transferred inverted from the output of the scanning inverter 682a,b to the output of the output inverter 684a,b, in the second phase new information is also transported to the input of the scanning inverter 682a,b. With a series of such alternating phases a test patterns is transported through scan chain 62.

Once the test pattern has arrived at the relevant storage elements, an evaluation phase starts. Test control unit 64 clocks scanning inverters 682 so that they receive no power supply current, and it clocks output inverters 684a,b so that they do receive power supply current. Test control unit 64 then clocks NOR gates 680a,b so that they received power supply current. Because of delay element 66 one of NOR gates 680a,b starts receiving power supply current a well define time interval before the other. Once a NOR gate 680a,b starts receiving power supply current it starts passing signals from its inputs, including the relevant input signal of interface element 68, to its output.

Thus, the input signal can start affecting the state of the interface element one after the other. As long as the input signals do not affect the state (being logic low for example) the state is determined by data from the test pattern that has been fed to the interface element through scan chain 62 during the shift phase. At the end of the evaluation phase signals from scan chain 62 have resulted into output signals at the outputs of combinatorial logic circuits 60a-d and interface element 68.

After the evaluation phase output data is captured by scan chain 62 and shifted out through scan chain 62 in a shift-out phase. Shift out is controlled by test control unit 64 in basically the same way as shift in.

Thus, the circuit of FIG. 6 provides for both enabling of the input signals and setting of the initial state of interface element 68, with a circuit that requires a small amount of components. Although the circuit is illustrated in terms of a set-reset flip-flop it will be readily appreciated that a similar circuit can be realized with an interface element that functions as a mutual exclusion element. Also cross-coupled NAND gates may be used instead of NOR gates 680a,b.

Moreover, it will be appreciated that the invention is not limited to the circuit of FIG. 6, for example the output of one output inverter 684a,b need not be directly coupled to the scanning inverter 682a,b of the interface element 68. Other storage elements may intervene. In fact it may not be necessary that both NOR gates 680a,b are included in scan chain 62: one of the NOR gates may be controlled as shown in FIG. 1. Similarly, it is not necessary to use output inverters 684a,b as part of the scan chain: other inverters may be used. Also, scan chain 62 need not be used for both shifting test patterns in and results out, other methods might be used to apply test patterns or read result patterns.

Although the circuit has been described in terms of testing, it will be appreciated that an interface element with an activatable difference between the delays with which input signals affect the interface circuit can also be used outside a test context, for example for sampling purposes. For example, to poll interrupt requests it may be necessary to sample the output of a mutual exclusion element. Such sampling may lead to errors if a meta-stable state of the interface element occurs at the time of sampling. By creating a differential delay, and more preferably by disabling the inputs of the interface element temporarily and reenabling them with a delay relative to one another prior to sampling such meta-stable states can be prevented, or at least the probability of their occurrence can be reduced. However, it is especially advantageous to control activation of the delay with a test control circuit, because test procedures require some abnormal operation of the circuit (such as transport of test patterns) that would distort the test results that involve interface elements unless the test control is capable of ensuring a deterministic response.

The invention claimed is:

1. An electronic circuit comprising:
   components that operate asynchronously of one another;
   an interface element, the interface element having an output and at least two inputs, each input coupled to a respective one of the components, the interface element supplying a logic output signal that is a logical function of signals at the inputs, dependent on the relative timing with respect to each other of the signals at the inputs;
   a delay element coupled to cause a relative delay between the time intervals after which signals at the inputs affect the interface element; and
   a control circuit for selectively activating the relative delay caused by the delay element prior to sampling an output signal of the interface element.

2. An electronic circuit according to claim 1 further comprising a test signal source coupled to the interface element, the control circuit being a test control circuit for switching the electronic circuit between a normal operating mode and the test mode, so that the signals at the inputs become affected by test signals from the test signal source during the test mode, the test control circuit activating said relative delay in the test mode and keeping the relative delay deactivated in the normal operating mode.

3. An electronic circuit according to claim 2, comprising a scan chain for transporting test result patterns in the test mode, the scan chain being coupled to the interface element for reading information that depends on the output signal of the interface element.

4. An electronic circuit according to claim 1, wherein the interface element has enabling inputs, each for enabling signals from a respective one of the inputs, the control circuit having an activation output for supplying a deactivation signal followed by an activation signal during operation, the activation output being coupled to the enabling inputs, at least one of the enabling inputs via the delay element, so that the delay element causes a difference between the time intervals after which an activation signal from the activation output reaches different ones of the enabling inputs.

5. An electronic circuit according to claim 4, wherein the interface element comprises a pair of cross-coupled logic gates, at least one of the logic gates comprising a logic section and power supply interruption elements in series between an output of the at least one of the logic gates and power supply connections of the electronic circuit, the power supply interruption elements being arranged for switchably interrupting connections between an output of the at least one of the logic gates and both power supply connections of the electronic circuit, each input of the interface element being coupled to the logic section of a respective one of the logic gates, one of the disabling inputs being coupled to control inputs of the power supply connection element of the at least one of the logic gates.

6. An electronic circuit according to claim 5, further comprising:
   a test control circuit for switching the electronic circuit between a normal operating mode and the test mode, the test control circuit activating said relative delay in the test mode and deactivating the relative delay in the normal operating mode, and
   a scan chain for shifting test patterns in and/or out of the electronic circuit, the test patterns affecting input signals of the interface element in the test mode, wherein an output node of the at least one of the logic gates is incorporated as a dynamic storage node in the scan chain.

7. A method of testing an electronic circuit that comprises components that operate asynchronously of one another and an interface element, the interface element having an output and at least two inputs, each input coupled to a respective one of the components, the interface element supplying a logic output signal that is a logical function of signals at the inputs and dependent on the relative timing with respect to each other of the signals at the inputs, the method comprising:

switching the electronic circuit to a test mode;

applying test input signals to the electronic circuit from a test signal source; and causing a difference between the time intervals after which the test signal source affects different ones of the signals at the inputs, the test control circuit activating said difference in the test mode and keeping the difference deactivated in the normal operating mode.

* * * * *